United States Patent
Kalita et al.

(10) Patent No.: US 12,406,832 B2
(45) Date of Patent: Sep. 2, 2025

(54) SEMICONDUCTOR CHAMBER COMPONENTS WITH ADVANCED DUAL LAYER NICKEL-CONTAINING COATINGS

(71) Applicant: Applied Materials, Inc., Santa Clara, CA (US)

(72) Inventors: Laksheswar Kalita, Milpitas, CA (US); Nitin K. Ingle, San Jose, CA (US); Nilesh Mistry, Hayward, CA (US); Jonathan J. Strahle, San Francisco, CA (US); Christopher L. Beaudry, San Jose, CA (US); Lok Kee Loh, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 203 days.

(21) Appl. No.: 18/370,132

(22) Filed: Sep. 19, 2023

(65) Prior Publication Data

US 2025/0095968 A1    Mar. 20, 2025

(51) Int. Cl.
  *H01J 37/32*    (2006.01)
(52) U.S. Cl.
  CPC .............................. *H01J 37/32495* (2013.01)
(58) Field of Classification Search
  CPC ........................ H01J 37/32495; H01J 37/32477
  See application file for complete search history.

(56) References Cited

U.S. PATENT DOCUMENTS

| | | | | |
|---|---|---|---|---|
| 2022/0181124 A1* | 6/2022 | Duan | ............... | H01J 37/32477 |
| 2023/0103643 A1* | 4/2023 | Kalita | ................ | C23C 18/1639 |
| | | | | 156/345.34 |

FOREIGN PATENT DOCUMENTS

| | | |
|---|---|---|
| KR | 101324763 B1 | 11/2013 |
| KR | 20180129156 A | 12/2018 |
| WO | 2022/011165 A1 | 1/2022 |
| WO | 2022/120063 A1 | 6/2022 |
| WO | 2023/059502 A1 | 4/2023 |

OTHER PUBLICATIONS

International Search Report and Written Opinion for PCT/US2023/086166 mailed Jun. 10, 2024, 10 pages.

\* cited by examiner

*Primary Examiner* — Joseph L Williams
(74) *Attorney, Agent, or Firm* — Kilpatrick Townsend & Stockton LLP

(57) ABSTRACT

Exemplary methods for a coating a component of a semiconductor processing system may include forming a nickel-containing alloy on an exposed surface the component of the semiconductor processing system. The methods may include forming plasma effluents of a fluorine-containing precursor. The methods may include contacting the nickel-containing alloy with the plasma effluents of the fluorine-containing precursor. The contacting may fluorinate a portion of the nickel-containing alloy to form a nickel-and-fluorine-containing material overlying the nickel-containing alloy.

20 Claims, 5 Drawing Sheets

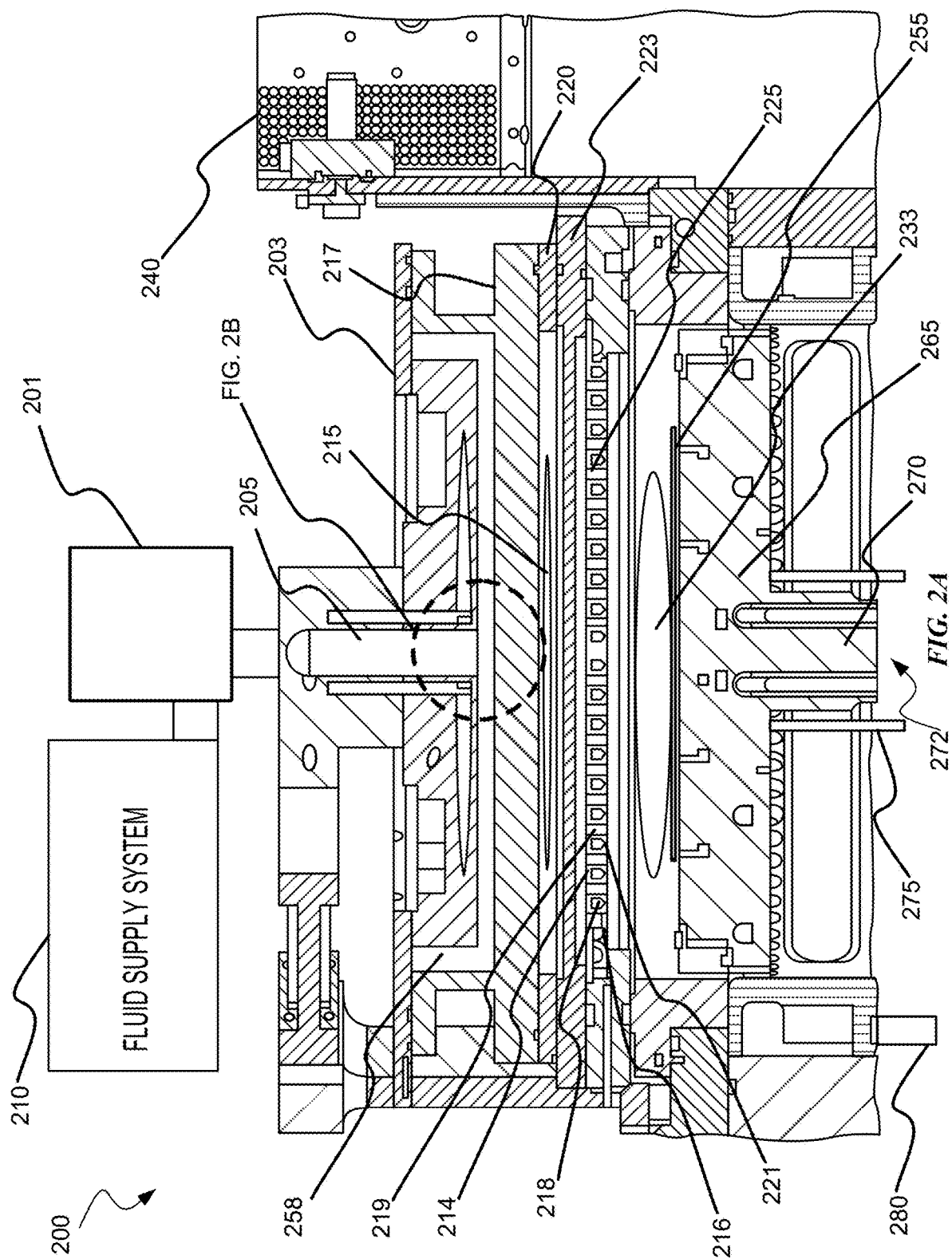

SEMICONDUCTOR CHAMBER COMPONENTS WITH ADVANCED DUAL LAYER NICKEL-CONTAINING COATINGS

TECHNICAL FIELD

The present technology relates to semiconductor systems, processes, and equipment. More specifically, the present technology relates to systems including or forming coatings on chamber components.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Wet processes may also damage chamber components. For example, HF etchants may chemically attack chamber components made from metals, such as aluminum alloys. Dry etches produced in local plasmas formed within the substrate processing region can penetrate more constrained trenches and exhibit less deformation of delicate remaining structures. However, local plasmas may damage the substrate through the production of electric arcs as they discharge. Local plasmas, as well as plasma effluents, may also damage chamber components.

Thus, there is a need for improved systems and methods that can be used to produce high quality devices and structures. These and other needs are addressed by the present technology.

BRIEF SUMMARY

Exemplary semiconductor processing systems may include a chamber including one or more chamber components. At least one of the one or more chamber components may include a dual-layer nickel-containing coating. The dual-layer nickel-containing coating may include a first layer that may be or include a nickel-containing alloy and a second layer overlying the first layer. The second layer may be or include a nickel-and-fluorine-containing material.

In some embodiments, the chamber components may be or include stainless steel. The stainless steel may include chromium (Cr), iron (Fe), or both. A thickness of the dual-layer nickel-containing coating may be less than or about 50 μm. A thickness of the second layer of the dual-layer nickel-containing coating may be less than or about 5 μm. A thickness of the dual-layer nickel-containing coating may be less than or about 250 nm.

Some embodiments of the present technology may encompass methods for a coating a component of a semiconductor processing system. The methods may include forming a nickel-containing alloy on an exposed surface the component of the semiconductor processing system. The methods may include forming plasma effluents of a fluorine-containing precursor. The methods may include contacting the nickel-containing alloy with the plasma effluents of the fluorine-containing precursor. The contacting may fluorinate a portion of the nickel-containing alloy to form a nickel-and-fluorine-containing material overlying the nickel-containing alloy.

In some embodiments, the methods may include, prior to forming the nickel-containing alloy, removing a native oxide from the exposed surface of the component of the semiconductor processing system. Removing the native oxide from the exposed surface of the component of the semiconductor processing system may include contacting the native oxide with a chlorine-containing precursor or plasma effluents of the chlorine-containing precursor. The nickel-containing alloy may be formed via electroless nickel plating, electroplating, atomic layer deposition (ALD), chemical vapor deposition (CVD), plasma-enhanced chemical vapor deposition (PECVD), physical vapor deposition (PVD), electron-beam physical vapor deposition (EBPVD), or plasma spraying. The fluorine-containing precursor may be or include diatomic fluorine ($F_2$), hydrogen fluoride (HF), ammonium fluoride ($NH_4F$), ammonium bifluoride (HF—$NH_4F$), or nitrogen trifluoride ($NF_3$). The methods may include forming plasma effluents of a hydrogen-containing precursor while forming the plasma effluents of the fluorine-containing precursor. A temperature may be maintained at less than or about 500° C. while contacting the nickel-containing alloy with the plasma effluents of the fluorine-containing precursor. A pressure may be maintained at less than 760 Torr while contacting the nickel-containing alloy with the plasma effluents of the fluorine-containing precursor. A thickness of the nickel-and-fluorine-containing material overlying the nickel-containing alloy may be less than or about 30 μm. The nickel-and-fluorine-containing material overlying the nickel-containing alloy may be formed in less than or about 24 hours.

Some embodiments of the present technology may encompass methods for a coating a component of a semiconductor processing system. The methods may include removing a native oxide from an exposed surface of the component of the semiconductor processing system. The methods may include forming a nickel-containing alloy on the exposed surface the component of the semiconductor processing system. The methods may include forming plasma effluents of a fluorine-containing precursor. The methods may include contacting the nickel-containing alloy with the plasma effluents of the fluorine-containing precursor. The contacting may fluorinate at least portion of the nickel-containing alloy to form a nickel-and-fluorine-containing material on the expose surface.

In some embodiments, the component may be a pedestal, a bellows, a lid stack, a faceplate, a showerhead, a gas line, a gas panel, a MFC, or a foreline. The native oxide may be or include chromium oxide ($CrO_x$). The contacting may fluorinate an entire exposed surface of the nickel-containing alloy.

Such technology may provide numerous benefits over conventional systems and techniques. For example, embodiments of the present technology may protect even hard to reach portions of chambers, such as increasingly small faceplate or showerhead apertures from any number of corrosive processes. Additionally, the coatings formed on the substrate supports and/or other components may be maintained for hundreds or thousands of wafers, due to the improved density of the coating, which may increase throughput, and also be maintained even in highly corrosive atmospheres. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 2A shows a schematic cross-sectional view of an exemplary processing chamber according to embodiments of the present technology.

Figure 1:
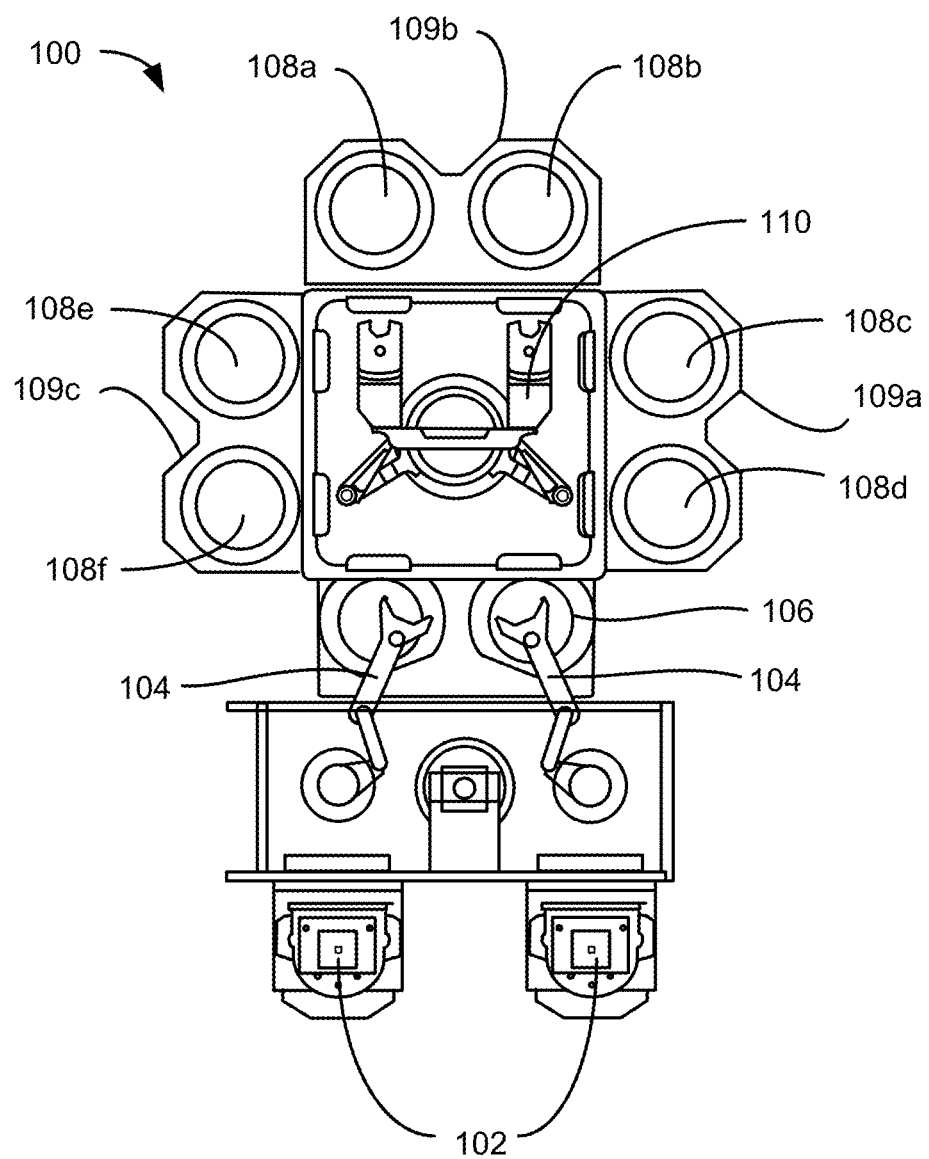
FIG. 1 shows a top plan view of an exemplary processing system according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Semiconductor processing may include a number of operations that produce intricately patterned material on a substrate. The operations may include a number of formation and removal processes, which may utilize corrosive or erosive materials, including plasma-enhanced materials formed either remotely or at the substrate level. While an etchant may preferentially etch the substrate material, the chemical etchant may also contact other components within the chamber. The etchant may chemically attack the components, and depending on the process performed, one or more of the components may be bombarded with plasma effluents, which may also erode component materials. The chemical and physical damage to the chamber components caused by the etchant may cause wear over time, which may increase replacement costs and down time for the chamber, as well as potentially contaminate the chamber with chamber substrate-reactive species formed from erosion of chamber walls. As one non-limiting example, in some local or wafer-level plasma operations, a showerhead or manifold may operate as a ground electrode to develop plasma in the substrate processing region, where the substrate support or some other component may operate as the plasma-generating electrode. The showerhead operating as the ground electrode may be bombarded by plasma species, releasing metallic species that form the showerhead into the plasma, and potentially contaminating substrates being processed with metallic specs from the showerhead.

Conventional technologies have struggled to limit both corrosion and erosion to chamber components and tend to replace components regularly due to the damage caused by one or both of these mechanisms. Accordingly, some conventional designs may routinely exchange the showerhead or coat the showerhead with a material that may resist the bombardment. Attempts have been made to improve coatings using high quality deposition techniques, such as e-beam or plasma spray. However, while such coatings may operate sufficiently against some bombardment, or erosion, they do not sufficiently withstand a chemical reaction with plasma effluent species or contact with high energy plasma species. Namely, such exposure may still cause removal of the coating and eventual erosion and corrosion of the component, particularly in areas where high energy plasmas are present. Moreover, many chamber components include hard to access connections, holes, lid stacks, and the like as well as increasingly small features, such as showerheads and/or faceplates which include a number of apertures for delivering species through the chamber. If the coatings cannot completely coat all exposed surfaces, plasma species that may be developed may corrode or erode the component.

The present technology overcomes these issues and others by coating chamber components prior to substrate processing with advanced dual layer nickel-containing coatings. For example, chamber components may be completely coated on surfaces exposed within a semiconductor processing chamber. Additionally, the coatings may be characterized by increased thicknesses and/or density, which may improve both resistance to chemical systems and high powered plasma systems, as well as allowing the component to be used in processing a number of wafers before the coating is reapplied. Moreover, as the coating is already at least partially halogenated, "first wafer effect" may be greatly diminished, if not eliminated. Furthermore, due to the unique methods presented herein, coatings according to the present technology may be applied in-situ within the assembled semiconductor processing chamber (e.g., chamber that will be utilized to process substrates). Thus, chambers and components therein may be easily re-coated without removing the unit from the processing stream. In addition, such processes allow for greater coverage of exposed surfaces of the chamber and components thereof reducing the surfaces at risk of corrosion and erosion during processing.

Although the remaining disclosure will routinely identify specific etching and deposition processes utilizing the disclosed technology, it will be readily understood that the systems and methods are equally applicable to deposition and cleaning processes and chambers as may occur in the described chambers or other chambers. Accordingly, the technology should not be considered to be so limited as for use with any particular etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f can be outfitted to perform a number of substrate processing operations including cyclical layer deposition (CLD), atomic layer deposition (ALD), chemical vapor deposition (CVD), physical vapor deposition (PVD), plasma-enhanced chemical vapor deposition (PECVD), etch, pre-clean, degas, orientation, and other substrate processes. The substrate processing chambers 108a-f may include one or more system components for depositing, annealing, curing and/or etching. Any one or more of the processes described herein may be carried out in chamber(s) separated from the fabrication system shown in different embodiments. It will be appreciated that additional configurations of chambers 108a-f are contemplated by system 100.

FIG. 2A shows a cross-sectional view of an exemplary process chamber system 200 with partitioned plasma generation regions within the processing chamber. During coating according to the present technology, a process gas may be flowed into the first plasma region 215 through a gas inlet assembly 205. A remote plasma system (RPS) 201 may optionally be included in the system and may process a first gas which then travels through gas inlet assembly 205. The inlet assembly 205 may include two or more distinct gas supply channels where the second channel (not shown) may bypass the RPS 201, if included.

Chamber components, such as a cooling plate 203, faceplate 217, ion suppressor 223, showerhead 225, and a pedestal 265, having a substrate 255 disposed thereon, are shown and may each be included according to embodiments. The cooling plate and faceplate may operate as aspects of a lid assembly, also referred to as a lid stack, in some embodiments. The pedestal 265 may have a heat exchange channel through which a heat exchange fluid flows to control the temperature of the substrate, which may be operated to heat and/or cool the substrate or wafer during processing operations. The substrate support platter of the pedestal 265, which may include aluminum, ceramic, or a combination thereof, may also be resistively heated in order to achieve relatively high temperatures, such as from up to or about 100° C. to above or about 1100° C., using an embedded resistive heater element. The pedestal 265 may be supported by a shaft 270 extending through an opening 272 in the chamber. The opening 272 may be sealed by a bellows 275 that surrounds the shaft 270.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. While not illustrated in FIG. 2A, the fluid supply system 210 may include one or more gas lines, a gas panel, and/or a mass flow controller. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205. To remove excess gases and/or gaseous byproducts from the chamber, a foreline 280 may be in fluid communication with the chamber. For example, the foreline 280 may couple with a pumping plate and be a part of an exhaust system, which may also include one or more throttle valves.

The ion suppressor 223 may comprise a plate or other geometry that defines a plurality of apertures throughout the structure that are configured to suppress the migration of ionically charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter the etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215 and/or substrate processing region 233. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225, or in both the chamber plasma region 215 and substrate processing region 233. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
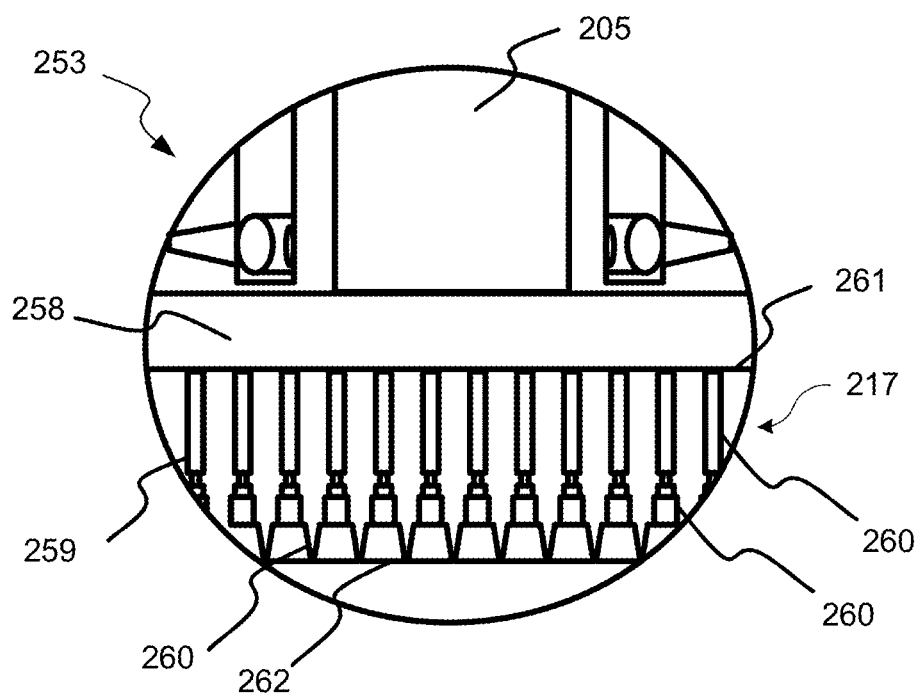
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233 but may be partially or fully prevented from backflow into the gas supply region 258 after traversing the faceplate 217.

As illustrated, faceplate 217 defines a plurality of apertures 259. While any shaped aperture 259 is contemplated, it should be clear that regardless of the shape, each aperture 259 defines an exposed aperture surface 260 extending around an interior of each aperture 259 from a first side 261 of faceplate 217 to a second side 262 of faceplate 217, that is exposed or in fluid connection with first plasma region 215 and gas inlet assembly 205. Moreover, in embodiments, the exposed aperture surface 260 of all apertures 259 may define an aperture surface area of faceplate 217.

Figure 3:
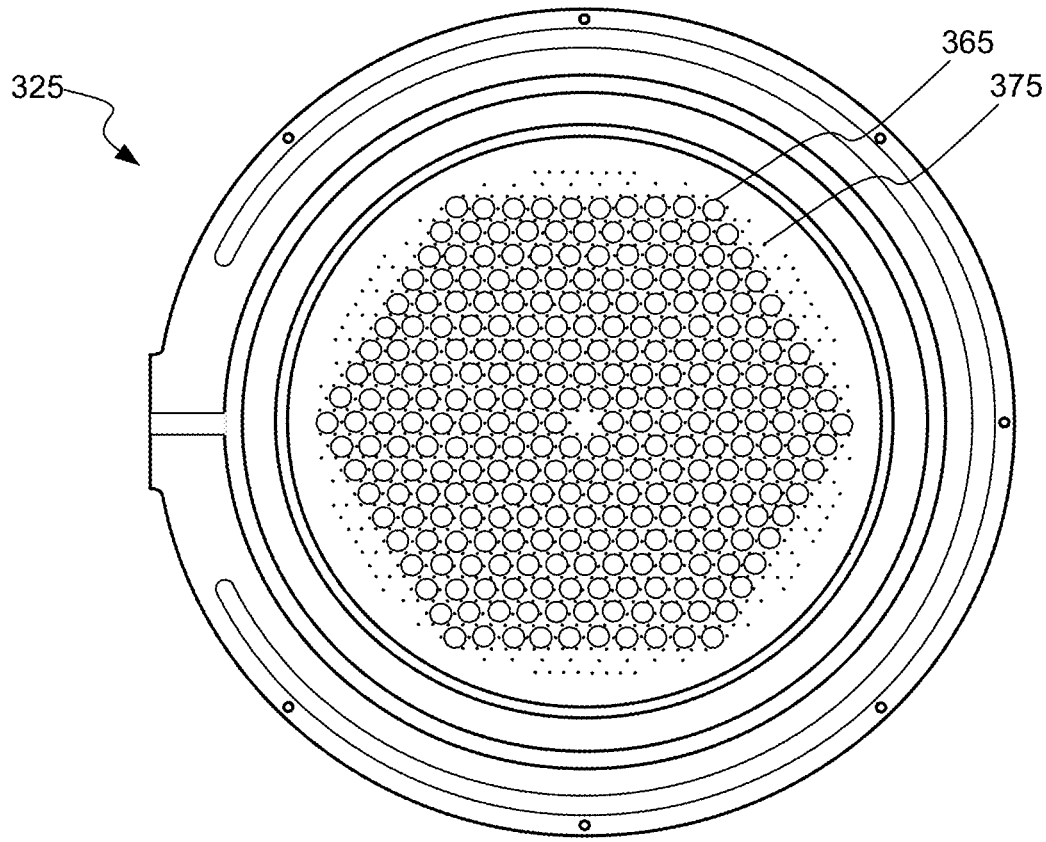
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first apertures 219 through the upper and lower plates, and second apertures 221 through the lower plate 216. The formed channels may be configured to provide fluid access from the volume 218 through the lower plate 216 via second apertures 221 alone, and the first apertures 219 may be fluidly isolated from the volume 218 between the plates and the second fluid channels 221. The volume 218 may be fluidly accessible through a side of the gas distribution assembly including showerhead 225. However, it should be understood that, in embodiments, only a single type of aperture 219 may be defined through showerhead 225, and/or apertures 219 and 221 may be collectively referred to as "showerhead apertures". Moreover, in embodiments, first apertures 219 and second apertures 221 may both extend fully or partially through showerhead 225 providing fluid access between first plasma region 215 and processing region 233. Furthermore, in embodiments, showerhead 225 may be formed from only one plate.

Nonetheless, as illustrated, showerhead 225 defines a plurality of apertures 219/221. While any shaped aperture 219/221 is contemplated, it should be clear that regardless of the shape, each aperture 219/221 defines an exposed aperture surface 263 extending around each aperture 219/221 from a first side 264 of showerhead 225 to a second side 266 of showerhead 225, that is exposed or in fluid connection with first plasma region 215 and processing region 233. Moreover, in embodiments, the exposed aperture surface 263 of all apertures 219/221 may define an aperture surface area of showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first apertures 219, may have a plurality of shapes and configurations in order to control and affect the flow of precursors through the showerhead 225. Small holes 375, which show a view of second apertures 221, may be distributed substantially evenly over the surface of the showerhead, even amongst the through-holes 365, and may help to provide more even mixing of the precursors as they exit the showerhead than other configurations.

Figure 4:
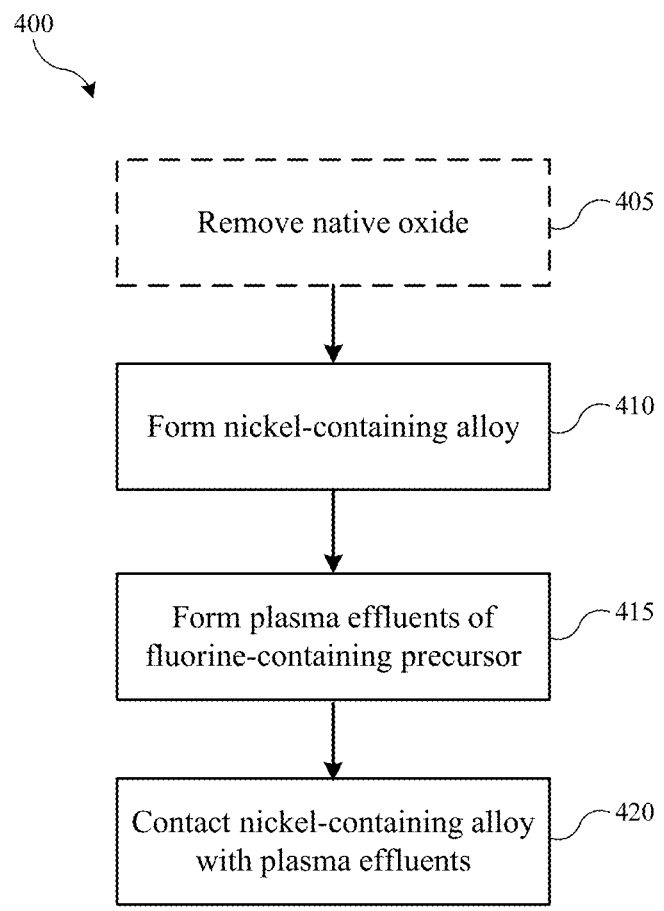
FIG. 4 shows exemplary operations in a method according to some embodiments of the present technology.

FIG. 4 shows exemplary operations in a method 400 according to some embodiments of the present technology. The method may be performed in a variety of processing chambers, including processing chamber 100 described above. Method 400 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 400 may include additional operations prior to initiation of the listed operations. For example, additional processing operations may include forming or providing chamber components. Prior processing operations may be performed in the chamber in which method 400 may be performed, or processing may be performed in one or more other processing chambers prior to delivering or installing the chamber component(s) into the semiconductor processing chamber in which method 400 may be performed. Regardless, method 400 may optionally include delivering one or more chamber components to a processing region of a semiconductor processing system 100, such as processing chamber 108a-f described above, or other chambers that may include components as described above. The chamber component(s) may be deposited within one or more process chambers 108a-f, such as a processing region 120 of the chamber described above. Method 400 describes operations shown schematically in FIGS. 5A-5C, the illustrations of which will be described in conjunction with the operations of method 400. It is to be understood that FIGS. 5A-5C illustrate only partial schematic views, and one or more chamber component(s) may include further components as illustrated in the figures, as well as alternative components, of any size or configuration that may still benefit from aspects of the present technology.

Figure 5A:
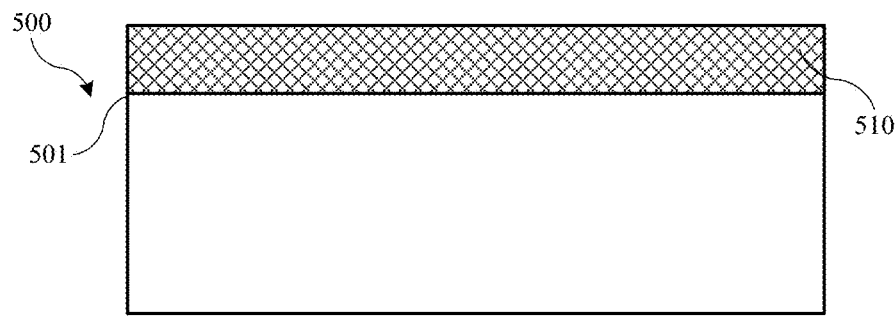
FIGS. 5A-5C show a schematic partial cross-sectional view of an exemplary chamber component according to some embodiments of the present technology.
Figure 5B:
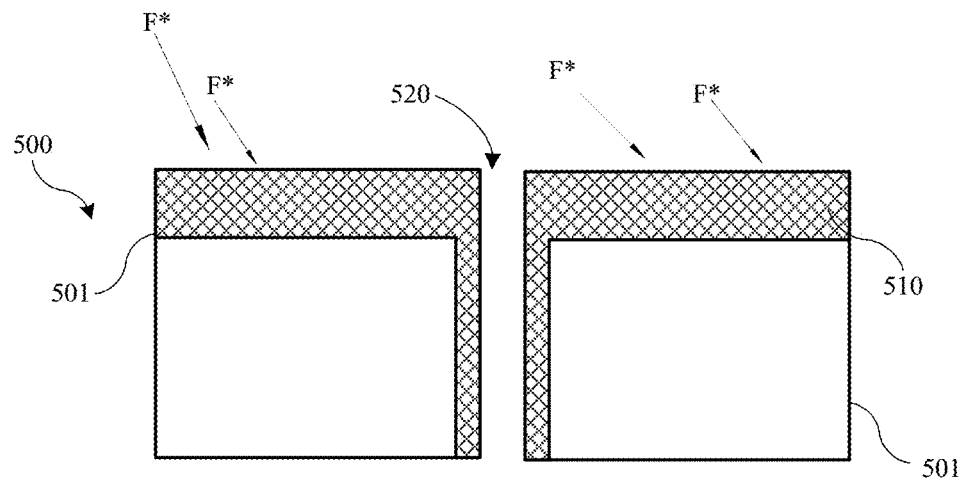
Figure 5C:
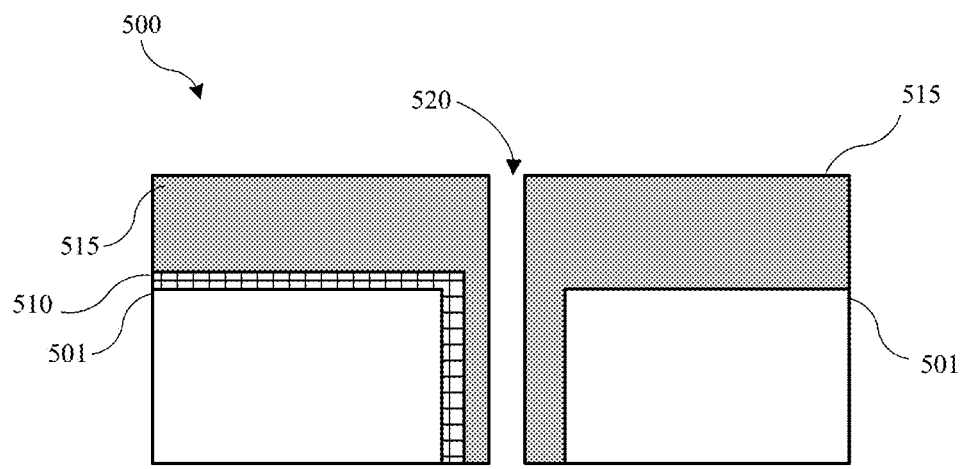

FIGS. 5A-5C illustrate a chamber component 500 that may be coated according to embodiments of the present technology. As discussed above, the chamber component 500 can be any one or more chamber components having a surface exposed to an interior of a semiconductor processing chamber, such as process system 100 or process chamber system 200 discussed above. Thus, in embodiments, the chamber component 500 can be one or more of a pedestal, a bellows, a lid stack, a faceplate, a showerhead, a gas line, a gas panel, a MFC, a foreline, a cooling plate, an ion suppressor, a baffle, supplies, inlets, outlets, and supports thereof, or the like. Namely, in embodiments, the chamber component 500 may be any one or more components used in a plasma processing chamber. In embodiments, the chamber component 500 may be assembled in a processing chamber 108a-f or a processing chamber of processing system 200 (e.g., for an in-situ process as will be discussed in greater detail below), or may be placed in a processing chamber 108a-f, such as on a support within a processing chamber (e.g., for an ex-situ process).

As illustrated in FIG. 5A, the chamber component 500 may include an exposed surface 501. The exposed surface 501 may include a plurality of features, such as groves, apertures, features, or the like, depending upon the specific chamber component 500. In some embodiments and is illustrated in FIG. 5B, the chamber component 500 may include a plurality of apertures 520, such as when chamber component 500 is a faceplate and/or a showerhead.

FIGS. 5A-5C show schematic cross-sectional views of exemplary corrosion and erosion resistant coatings deposited on a chamber component 500 according to some embodiments of the present technology. The figures provide exemplary views of various coating configurations intended to illustrate possible coating applications encompassed by embodiments of the present technology and may include coatings on a number of components in chamber system 200, or other components that may benefit from corrosion and erosion resistant coatings. It is to be understood that additional and alternative coating applications may be used during method 400, which will be discussed in greater detail. The coating application, such as number of layers and type of layers formed, may depend on the type of component the coating is applied to and the configuration of the component. For example, if the component includes one or more apertures, the coating may include two or more layers or two or more applications (without forming a delineation between layers) of material to provide complete coverage of the chamber component's exposed surface including the exposed surface of the respective aperture(s). The exemplary chamber component 500 provided in FIGS. 5A-5C may be an illustration of any of the chamber components previously described.

In some embodiments, the chamber component 500 may be made from aluminum, chromium, magnesium, nickel, alloys thereof, including stainless steel or Hastelloy, combinations thereof, or the like. Alloys often contain impurities of various alloying metals, even when the chamber component 500 contains high purity metal alloy. For example, aluminum alloys generally contain trace amounts of nickel, copper, iron, manganese, and chromium. In some embodiments, impurities may be present in aluminum alloys or alloys at the following atomic weight %: nickel ranging from about 0.001% to about 0.5%; iron ranging from about 0.001% to about 0.25 weight %; copper ranging from about 0.15% to about 0.35%; manganese ranging from about 0.001% to about 0.2%; zinc ranging from about 0.001% to about 0.15%; chromium ranging from about 0.04% to about 0.28%; titanium ranging from about 0.001% to about 0.06%, and magnesium ranging from about 0.8% to about 1.2%. Optionally, a total of other impurities present in the aluminum alloy may be about 0.15 weight % or less.

The illustration of FIGS. 5A-5C also includes a coating according to the present technology applied to an exposed surface 501 of chamber component 500. While the illustration only shows a coating applied to one surface of a chamber component, is to be understood that the coating may be included on all exposed surfaces (chamber facing surfaces, or surfaces exposed to the chamber, as discussed above) of the chamber component, and is shown as covering only the depicted surfaces for illustrative purposes. The corrosion and erosion resistant coating may be resistant to corrosion and erosion and be configured to protect component 500 from reactive etchants, including halogen-containing effluents, gases, etchants, or deposition treatments. For example, the corrosion and erosion resistant coating may be configured to protect component 500 from etchants or gases, even in high power processes, such as a CCP process.

Prior to forming the coatings of the present technology, some embodiments may include removing a native oxide from the exposed surface 501 of the component of the semiconductor processing system at optional operation 405. Removing the native oxide may include contacting the expose surface 501 of component 500 with a halogen-containing precursor or plasma effluents thereof. For example, the halogen-containing precursor may be or include a chlorine-containing precursor, such as hydrogen chloride (HCl), zinc chloride ($ZnCl_2$), or any other chlorine-containing material used or useful in semiconductor processing. In embodiments, the native oxide may be a metal oxide of a metal in the component 500. For example, the native oxide may be chromium oxide ($CrO_x$), nickel oxide ($NiO_x$), or any other metal oxide.

At operation 410, method 400 may include forming a nickel-containing alloy 510 on the exposed surface 501 of component 500. The nickel-containing alloy 510 may extend over an exposed surface 501 of component 500. The nickel-containing alloy 510 may be formed via electroless nickel plating, electroplating, atomic layer deposition (ALD), chemical vapor deposition (CVD), plasma-enhanced chemical vapor deposition (PECVD), physical vapor deposition (PVD), electron-beam physical vapor deposition (EBPVD), or plasma spraying, or the like, as known in the art. Further operations that will be discussed in greater detail below may be utilized to convert the nickel-containing alloy 510 to a halogen containing coating, which may modify the thickness and/or density of coating.

As the nickel-containing alloy 510 may not be the final coating of the present technology, there is no required thickness. However, since at least a portion of the nickel-containing alloy 510 may be halogenated, the thickness of the nickel-containing alloy 510 may impact the final thickness of the coating. Accordingly, the nickel-containing alloy 510 may be characterized by a thickness of greater than or about 5 nm, and may be characterized by a thickness of greater than or about 10 nm, greater than or about 50 nm, greater than or about 100 nm, greater than or about 250 nm, greater than or about 500 nm, greater than or about 750 nm, greater than or about 1 μm, greater than or about 2 μm, greater than or about 3 μm, greater than or about 4 μm, greater than or about 5 μm, greater than or about 6 μm, greater than or about 7 μm, greater than or about 8 μm, greater than or about 9 μm, greater than or about to 10 μm, greater than or about to 15 μm, greater than or about to 20 μm, greater than or about to 25 μm, greater than or about to 30 μm, or more, or any ranges or values therebetween. However, some applications may require reduced thicknesses, such as in gas lines or other components with limited space. Accordingly, the nickel-containing alloy 510 may be characterized by a thickness of less than or about 750 nm, and may be characterized by a thickness of less than or about 700 nm, less than or about 600 nm, less than or about 500 nm, less than or about 450 nm, less than or about 400 nm, less than or about 350 nm, less than or about 300 nm, less than or about 250 nm, less than or about 200 nm, less than or about 150 nm, less than or about 100 nm, less than or about 90 nm, less than or about 80 nm, less than or about 70 nm, less than or about 60 nm, less than or about to 50 nm, less than or about to 40 nm, less than or about to 30 nm, less than or about to 20 nm, less than or about to 10 nm, or less, or any ranges or values therebetween. However, as noted above, the thickness of the nickel-containing alloy 510 may not be critical, as the thickness and/or density may be modified during subsequent operations according to the present technology.

In embodiments when the chamber component 500 has small size features or apertures 520, two or more coating methods may be utilized in order to provide the nickel-containing alloy 510 over substantially all of the exposed surface 501 of the chamber component 500. As previously discussed, subsequent operation may convert the underlying the nickel-containing alloy 510 to a halogen-containing material. Thus, the nickel-containing alloy 510 may be formed on all exposed surfaces 501 where it is desired to form the halogen-containing material of the present technology. Accordingly, in some embodiments, e-beam, thermal spray, or the like may be utilized to form a high thickness and quality nickel-containing alloy 510 over a planar surface of the component (and/or line of sight exposed surface), and an ALD process or the like may be utilized to deposit over small features or apertures 520 (and/or non-line of sight exposed surfaces).

Regardless of the deposition method(s) used, the exposed surface(s) 501 of the one or more chamber components 500 may define an exposed surface area (e.g., the surface area of all exposed surfaces to be coated), where at least about 50% of the exposed surface area has the nickel-containing alloy 510 formed thereon, such as greater than or about 60%, greater than or about 70%, greater than or about 80%, greater than or about 85%, greater than or about 90%, greater than or about 95%, greater than or about 97.5%, greater than or about 99%, or more, or any ranges or values therebetween.

Moreover, as discussed above, it should be clear that when the chamber component or components include one or more plurality of apertures, the exposed aperture surface area is included in the chamber component(s) exposed surface area. Regardless, in embodiments, at least about 50% of an exposed aperture surface area, which may include the surface area of apertures of a faceplate, a showerhead, a combination thereof, or the like, may have the nickel-containing alloy 510 deposited thereon, such as greater than or about 60%, greater than or about 70%, greater than or about 80%, greater than or about 85%, greater than or about 90%, greater than or about 95%, greater than or about 97.5%, greater than or about 99%, or more, or any ranges or values therebetween, such as illustrated in FIG. 5B.

After formation of the nickel-containing alloy 510, method 400 may include forming plasma effluents of a halogen-containing precursor, such as a fluorine-containing precursor, at operation 415. Additionally, a hydrogen-containing precursor may be provided with the fluorine-containing precursor. Accordingly, method 300 may include forming plasma effluents of a hydrogen-containing precursor while forming the plasma effluents of the fluorine-containing precursor. In some embodiments, the plasma effluents may be formed in a remote plasma region within the chamber or fluidly coupled with the chamber. Following remote formation, the plasma effluents generated in the remote plasma region may be flowed into the processing region in accordance with the discussion above with reference to FIGS. 1-3. In other embodiments, the plasma effluents may be formed locally within the processing region. Once the plasma effluents are generated, at operation 420, the nickel-containing alloy 510 may be contacted with the plasma effluents.

As previously discussed, the halogen-containing precursor used to form plasma effluents at operation 415 may be, in some embodiments, a fluorine-containing precursor. The fluorine-containing precursor may be any fluorine-containing material. For example, the fluorine-containing precursor may be or include diatomic fluorine ($F_2$), hydrogen fluoride (HF), ammonium fluoride ($NH_4F$), ammonium bifluoride (HF—$NH_4F$), or nitrogen trifluoride ($NF_3$), or any other fluorine-containing material used or useful in semiconductor processing.

By contacting the nickel-containing alloy 510 with the plasma effluents of the fluorine-containing precursor, a portion of the nickel-containing alloy 510 may be converted to a nickel-and-fluorine-containing material 515 overlying the nickel-containing alloy 510. While referred to as a material containing nickel fluorine, the nickel-and-fluorine-containing material 515 may include various other elements such as, but not limited to, oxygen. Together, the nickel-containing alloy 510 and the nickel-and-fluorine-containing material 515 may form a dual-layer nickel-containing coating. Through continued exposure to the plasma effluents of the fluorine-containing precursor, at least a portion of the nickel-containing alloy 510 may be converted to a nickel-and-fluorine-containing material 515 as illustrated in FIG. 5C. This conversion provides multiple benefits. For instance, the conversion from nickel-containing alloy 510 to a nickel-and-fluorine-containing material 515 may increase the thickness and/or the density of the coating, providing a more robust coating able to withstand stronger chamber environments, or components that exhibit a longer lifetime. In addition, the conversion to nickel-and-fluorine-containing material 515 may impart the coating with fluorine within the coating itself. This may minimize or eliminate the first wafer effect, as the coating is less, or not, susceptible to interaction with plasma process gasses.

The present technology provides a marked improvement over conventional corrosion and erosion resistant coatings, as the coating of the present technology can be formed in-situ within the semiconductor processing chamber, allowing any exposed surface to be coated as it is presented in the chamber. Furthermore, for in-situ or ex-situ processes, the present technology allows for the formation of thicker coating than conventional methods, as well as robust coating of even small features or apertures.

Thus, in embodiments, operations 415 and/or 420 may be considered to be a high-power plasma process, and may therefore be conducted under conditions having an RF power of greater than or about 2 W, such as greater than or about 5 W, greater than or about 10 W, greater than or about 25 W, greater than or about 50 W, greater than or about 75 W, greater than or about W, greater than or about 250 W, greater than or about 500 W, greater than or about 750 W, greater than or about 1,000 W, greater than or about 1,500 W, greater than or about 2,000 W, greater than or about 2,500 W, greater than or about 3,000 W, or more, or any ranges or values therebetween. Power may be provided as known in the art or as discussed above. Moreover, the high-power plasma process may be conducted at a pressure of greater than or about 500 mTorr, such as greater than or about 750 mTorr, than or about 1 Torr, greater than or about 1.5 Torr, greater than or about 2 Torr, greater than or about 2.5 Torr, greater than or about 3 Torr, greater than or about 3.5 Torr, greater than or about 4 Torr, greater than or about 4.5 Torr, greater than or about 5 Torr, greater than or about 6 Torr, greater than or about 7 Torr, greater than or about 8 Torr, greater than or about 9 Torr, greater than or about 10 Torr, greater than or about 11 Torr, greater than or about 12 Torr, greater than or about 13 Torr, greater than or about 14 Torr, greater than or about 15 Torr, or more, or any ranges or values therebetween. Additionally, pressure may be maintained at less than or about 760 Torr, such as less than or about 700 Torr, less than or about 650 Torr, less than or about 600 Torr, less than or about 550 Torr, less than or about 500 Torr, less than or about 450 Torr, less than or about 400 Torr, less than or about 350 Torr, less than or about 300 Torr, less than or about 250 Torr, less than or about 200 Torr, less than or about 150 Torr, less than or about 100 Torr, less than or about 50 Torr, or less, or any ranges or values therebetween. Pressure may be maintained as known in the art or as discussed above.

Moreover, in embodiments, the high-power plasma process may be conducted at high temperatures, such as a temperature greater than or about 30° C., such as greater than or about 50° C., greater than or about 75° C., greater than or about 100° C., greater than or about 125° C., greater than or about 150° C., greater than or about 175° C., greater than or about 200° C., greater than or about 250° C., greater than or about 300° C., greater than or about 350° C., greater than or about 400° C., greater than or about 450° C., greater than or about 500° C., greater than or about 550° C., greater than or about 600° C., greater than or about 650° C., greater than or about 700° C., greater than or about 750° C., greater than or about 800° C., greater than or about 850° C., greater than or about 900° C., greater than or about 950° C., greater than or about 1,000° C., or more, or any ranges or values therebetween. Additionally, the high-power plasma process may be conducted at temperatures less than or about 1,000° C., such as less than or about 900° C., less than or about 800° C., less than or about 700° C., less than or about 600° C., less than or about 500° C., less than or about 450° C., less than or about 400° C., or less, or any ranges or values therebetween. Temperature may be maintained as known in the art or as discussed above.

In embodiments, the high-power plasma process may be conducted for a period of time sufficient to yield a nickel-and-fluorine-containing material 515 thickness of greater than or about 0.1 nm, such as greater than or about 1 nm, greater than or about 5 nm, greater than or about 10 nm, greater than or about 15 nm, greater than or about 20 nm, greater than or about 25 nm, greater than or about 50 nm, greater than or about 75 nm, greater than or about 100 nm, greater than or about 250 nm, greater than or about 500 nm, greater than or about 750 nm, greater than or about 1 μm, greater than or about 5 μm, greater than or about 10 μm, greater than or about 15 μm, greater than or about 20 μm, greater than or about 25 μm, greater than or about 30 μm, greater than or about 35 μm, or more, or an entirety of the thickness of the nickel-containing alloy 510. In embodiments, the high-power plasma process may be conducted for a period of time sufficient to yield a nickel-and-fluorine-containing material 515 thickness of less than or about 35 μm, less than or about 30 μm, greater than or about 25 μm, less than or about 20 μm, less than or about 15 μm, less than or about 10 μm, less than or about 5 μm, less than or about 1 μm, less than about 1000 nm, less than or about 900 nm, less than or about 800 nm, less than or about 700 nm, less than or about 600 nm, less than or about 500 nm, less than or about 400 nm, less than or about 300 nm, less than or about 200 nm, less than or about 100 nm, less than or about 80 nm, less than or about 60 nm, less than or about 40 nm, less than or about 20 nm, less than or about 15 nm, less than or about 10 nm, or less, or any ranges or values therebetween.

In embodiments, a thickness of the dual-layer nickel-containing coating, including the nickel-containing alloy 510 and the nickel-and-fluorine-containing material 515 may be less than or about 100 μm, and may be less than or about 90 μm, less than or about 80 μm, less than or about 70 μm, less than or about 60 μm, less than or about 50 μm, less than or about 40 μm, less than or about 30 μm, less than or about 20 μm, less than or about 10 μm, less than or about 5 μm, less than or about 1 μm, or less.

Additionally or alternatively, in embodiments, the high-power plasma process may be conducted for greater than or about 30 minutes, such as greater than or about 45 minutes, greater than or about 1 hour, greater than or about 1.5 hours, greater than or about 2 hours, greater than or about 2.5 hours, greater than or about 3 hours, greater than or about 3.5 hours, greater than or about 4 hours, greater than or about 4.5 hours, greater than or about 5 hours, or more, or any ranges or values therebetween. However, in embodiments, the period of time the high power plasma process is conducted is based upon one or more factors which may depend upon the desired process chamber, chamber component, or the like, such as coating thickness, or percent conversion of the nickel-containing alloy 510 to nickel-and-fluorine-containing material 515. In embodiments, the high-power plasma process may be conducted for greater than or about 24 hours, which may increase throughput and reduce down times, and may be conducted for less than or about 20 hours, less than or about 16 hours, less than or about 12 hours, less than or about 8 hours, less than or about 4 hours, less than or about 1 hour, less than or about 50 minutes, less than or about 40 minutes, less than or about 30 minutes, less than or about 20 minutes, less than or about 10 minutes, less than or about 5 minutes, less than or about 1 minutes, or less, or any ranges or values therebetween.

In embodiments, it is hypothesized that a possible reaction method for a process according to the present technology may be:

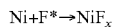

$$Ni + F^* \rightarrow NiF_x$$

As illustrated in FIG. 5C, depending on the processing conditions and/or the duration operations 415 and/or 420 are allowed to proceed, portions of chamber component 500 may include a dual layer nickel-containing coating that includes nickel-containing alloy 510 and nickel-and-fluorine-containing material 515. While nickel-containing alloy 510 is shown under nickel-and-fluorine-containing material 515, it should be understood that, in embodiments, nickel-containing alloy 510 may be contained in discrete spots or locations through the entire thickness of nickel-and-fluorine-containing material 515, or may exist only in a feature, such as in aperture 520. Thus, in embodiments, one or more apertures 520 may have a coating that is only partially converted, or that contains uncoated or fully converted portions.

Nonetheless, in embodiments, it should be understood that the high power plasma process may be conducted for a period of time sufficient to convert greater than or about 50% of the exposed surface area of the nickel-containing alloy 510 to nickel-and-fluorine-containing material 515, such as greater than or about 60% of the exposed surface area, greater than or about 70% of the exposed surface area, greater than or about 75% of the exposed surface area, greater than or about 80% of the exposed surface area, greater than or about 85% of the exposed surface area, greater than or about 90% of the exposed surface area, greater than or about 95% of the exposed surface area, greater than or about 97.5% of the exposed surface area, greater than or about 99% of the exposed surface area, or more, or any ranges or values therebetween.

Notwithstanding the process conditions selected, and as discussed above, it should be clear that, in embodiments, the present technology may be an "in-situ process". Such a process includes a process chamber that may be assembled with the necessary or desired chamber components for processing a substrate, and the chamber components are coated according to the present technology within the chamber that the chamber components themselves will ultimately be used to process substrates. Such a process may have additional advantages, such as ensuring that exposed surfaces are coated without unnecessarily coating covered or protected surfaces, in addition to the benefits discussed above. However, it should be clear that the present technology may also be used as an "ex-situ process", and still provide the benefits discussed above. In such a process, one or more components are loaded into a process chamber, coated according to the present technology, removed from the chamber, and then assembled in final process chamber in which the chamber components will be used to process a substrate. In embodiments, a chamber for coating a chamber component according to the present technology may be any process chamber in a processing system 100 or chamber system 200 discussed above. Nonetheless, in embodiments, the process chamber may be a CCP process chamber, a bias plasma chamber, or a combination thereof.

Corrosion and erosion resistant coatings formed according to the present technology may protect chamber components from chemical and plasma attack during processes, such as etching, deposition, and cleaning. The corrosion and erosion resistant coatings provided herein may reduce or eliminate the first wafer effect, as well as contamination of substrates with chamber component materials. Consequently, the present technology may improve device production, while additionally increasing component life within the processing chamber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system comprising:
a chamber comprising one or more chamber components, wherein at least one of the one or more chamber components comprise a dual-layer nickel-containing coating comprising:
a first layer comprising a nickel-containing alloy; and
a second layer overlying the first layer, wherein the second layer comprises a nickel-and-fluorine-containing material.

2. The semiconductor processing system of claim 1, wherein the chamber components comprise stainless steel.

3. The semiconductor processing system of claim 2, wherein the stainless steel comprises chromium (Cr), iron (Fe), or both.

4. The semiconductor processing system of claim 1, wherein a thickness of the dual-layer nickel-containing coating is less than or about 50 μm.

5. The semiconductor processing system of claim 1, wherein a thickness of the second layer of the dual-layer nickel-containing coating is less than or about 5 μm.

6. The semiconductor processing system of claim 1, wherein a thickness of the dual-layer nickel-containing coating is less than or about 250 nm.

7. A method for a coating a component of a semiconductor processing system, the method comprising:
forming a nickel-containing alloy on an exposed surface the component of the semiconductor processing system;
forming plasma effluents of a fluorine-containing precursor; and
contacting the nickel-containing alloy with the plasma effluents of the fluorine-containing precursor, wherein the contacting fluorinates a portion of the nickel-containing alloy to form a nickel-and-fluorine-containing material overlying the nickel-containing alloy.

8. The method of claim 7, further comprising:
prior to forming the nickel-containing alloy, removing a native oxide from the exposed surface of the component of the semiconductor processing system.

9. The method of claim 8, wherein removing the native oxide from the exposed surface of the component of the semiconductor processing system comprises contacting the native oxide with a chlorine-containing precursor or plasma effluents of the chlorine-containing precursor.

10. The method of claim 7, wherein the nickel-containing alloy is formed via electroless nickel plating, electroplating, atomic layer deposition (ALD), chemical vapor deposition (CVD), plasma-enhanced chemical vapor deposition (PECVD), physical vapor deposition (PVD), electron-beam physical vapor deposition (EBPVD), or plasma spraying.

11. The method of claim 7, wherein the fluorine-containing precursor comprises diatomic fluorine ($F_2$), hydrogen fluoride (HF), ammonium fluoride ($NH_4F$), ammonium bifluoride ($HF-NH_4F$), or nitrogen trifluoride ($NF_3$).

12. The method of claim 7, further comprising:
forming plasma effluents of a hydrogen-containing precursor while forming the plasma effluents of the fluorine-containing precursor.

13. The method of claim 7, wherein a temperature is maintained at less than or about 500° C. while contacting the nickel-containing alloy with the plasma effluents of the fluorine-containing precursor.

14. The method of claim 7, wherein a pressure is maintained at less than 760 Torr while contacting the nickel-containing alloy with the plasma effluents of the fluorine-containing precursor.

15. The method of claim 7, wherein a thickness of the nickel-and-fluorine-containing material overlying the nickel-containing alloy is less than or about 30 μm.

16. The method of claim 7, wherein the nickel-and-fluorine-containing material overlying the nickel-containing alloy is formed in less than or about 24 hours.

17. A method for coating a component of a semiconductor processing system, the method comprising:
removing a native oxide from an exposed surface of the component of the semiconductor processing system;
forming a nickel-containing alloy on the exposed surface the component of the semiconductor processing system;
forming plasma effluents of a fluorine-containing precursor; and
contacting the nickel-containing alloy with the plasma effluents of the fluorine-containing precursor, wherein the contacting fluorinates at least portion of the nickel-containing alloy to form a nickel-and-fluorine-containing material on the expose surface.

18. The method of claim 17, wherein the component comprises a pedestal, a bellows, a lid stack, a faceplate, a showerhead, a gas line, a gas panel, a MFC, or a foreline.

19. The method of claim 17, wherein the native oxide comprises chromium oxide ($CrO_x$).

20. The method of claim 17, wherein the contacting fluorinates an entire exposed surface of the nickel-containing alloy.

* * * * *